(12) United States Patent
Lai et al.

(10) Patent No.: US 7,643,299 B2
(45) Date of Patent: Jan. 5, 2010

(54) CLIP FOR HEAT SINK

(75) Inventors: Hsiu-Chang Lai, Taipei Hsien (TW);
Hung-Yi Wu, Taipei Hsien (TW);
Zhen-Xing Ye, Shenzhen (CN); Ke Sun,
Shenzhen (CN); Xiao-Zhu Chen,
Shenzhen (CN); Ming-Ke Chen,
Shenzhen (CN)

(73) Assignees: **Hong Fu Jin Precision Industry
(ShenZhen) Co., Ltd.**, Shenzhen,
Guangdong Province (CN); **Hon Hai
Precision Industry Co., Ltd.**, Tu-Cheng,
Taipei Hsien (TW)

( * ) Notice: Subject to any disclaimer, the term of this patent is extended or adjusted under 35 U.S.C. 154(b) by 180 days.

(21) Appl. No.: 11/840,222

(22) Filed: Aug. 17, 2007

(65) Prior Publication Data
US 2008/0101029 A1 May 1, 2008

(30) Foreign Application Priority Data
Oct. 31, 2006 (CN) .................... 2006 1 0201052

(51) Int. Cl.
*H05K 7/20* (2006.01)
*G06F 1/20* (2006.01)

(52) U.S. Cl. .................. 361/710; 361/679.54; 361/704; 361/709; 361/719; 165/80.2; 174/16.3; 24/458; 248/510

(58) Field of Classification Search ............ 361/679.54, 361/710, 697, 702, 709, 703–704, 719; 165/80.2–80.3, 165/185; 174/16.3; 24/453, 457–458; 248/505, 248/510
See application file for complete search history.

(56) References Cited
U.S. PATENT DOCUMENTS

| | | | | |
|---|---|---|---|---|
| 5,581,442 A * | 12/1996 | Morosas | .................... | 361/704 |
| 5,678,627 A * | 10/1997 | Lee | ............................ | 165/80.3 |
| 5,771,155 A * | 6/1998 | Cook | ......................... | 361/710 |
| 6,392,886 B1 * | 5/2002 | Lee et al. | .................... | 361/703 |
| 6,424,530 B1 * | 7/2002 | Lee et al. | .................... | 361/704 |
| 6,496,371 B2 * | 12/2002 | Winkel et al. | .............. | 361/703 |
| 6,518,507 B1 * | 2/2003 | Chen | ......................... | 174/252 |
| 6,775,138 B2 * | 8/2004 | Lee et al. | .................... | 361/697 |
| 6,947,283 B2 * | 9/2005 | Hsieh et al. | ................ | 361/703 |
| 7,142,429 B2 * | 11/2006 | Hsieh et al. | ................ | 361/710 |
| 7,167,369 B1 * | 1/2007 | Huynh et al. | .............. | 361/719 |
| 7,203,066 B2 * | 4/2007 | Lee et al. | .................... | 361/704 |
| 7,382,622 B2 * | 6/2008 | Li et al. | ...................... | 361/719 |
| 7,385,822 B1 * | 6/2008 | Li et al. | ...................... | 361/709 |
| 2008/0192436 A1 * | 8/2008 | Peng et al. | ................. | 361/709 |

* cited by examiner

*Primary Examiner*—Robert J Hoffberg
(74) *Attorney, Agent, or Firm*—Frank R. Niranjan

(57) ABSTRACT

A clip for mounting a heat sink on a circuit board includes a positioning coil for rotatably engaging with the heat sink. Two elongated arms extend from two ends of a line bisecting the positioning coil respectively, and a pair of hooks formed at distal portions of the two arms respectively for engaging with the circuit board.

12 Claims, 4 Drawing Sheets

CLIP FOR HEAT SINK

BACKGROUND OF THE INVENTION

1. Field of the Invention

The present invention relates to a clip for a heat sink, and more particularly to a clip which can readily and securely attach a heat sink to an electronic device.

2. Description of Related Art

A heat sink is usually placed in thermal contact with an electronic package such as a central processing unit (CPU), and transfers heat through conduction away from the electronic package so as to prevent over-heating of the electronic package. Usually, a heat sink is secured to an electronic package by using a clip.

Chinese patent No. 01242181.2 shows a heat sink assembly including a heat sink and a clip securing the heat sink to an electronic component mounted on a circuit board. The heat sink includes a base and a plurality of fins extending from the base. A plurality of grooves is defined between adjacent fins. Two neighboring fins located at two lateral sides of the groove in the middle of the heat sink project a pair of bulges on opposite inner walls thereof. The clip spans across the groove in the middle of the heat sink with a positioning coil received in the groove in a manner such that the positioning coil abuts against the bulges and the base of the heat sink. Two arms extending from two ends of the positioning coil have a pair of hooks engaging with the circuit board, thereby securing the heat sink to the circuit board.

When the aforementioned clip is retained in the heat sink, the clip can not move relative to the heat sink. However, there may be times when it is desirable for the clip to move relative to the heat sink.

What is needed is to provide a clip which is movably engaged with a heat sink.

SUMMARY OF THE INVENTION

In one embodiment, a clip for mounting a heat sink on a circuit board includes a positioning coil for rotatably interferingly engaging with the heat sink. Two elongated arms extend from two ends of a line bisecting the portion respectively, and a pair of hooks formed at distal portions of the two arms respectively for engaging with the circuit board.

Other advantages and novel features of the invention will become more apparent from the following detailed description when taken in conjunction with the accompanying drawings, in which:

DETAILED DESCRIPTION OF THE INVENTION

Figure 1:
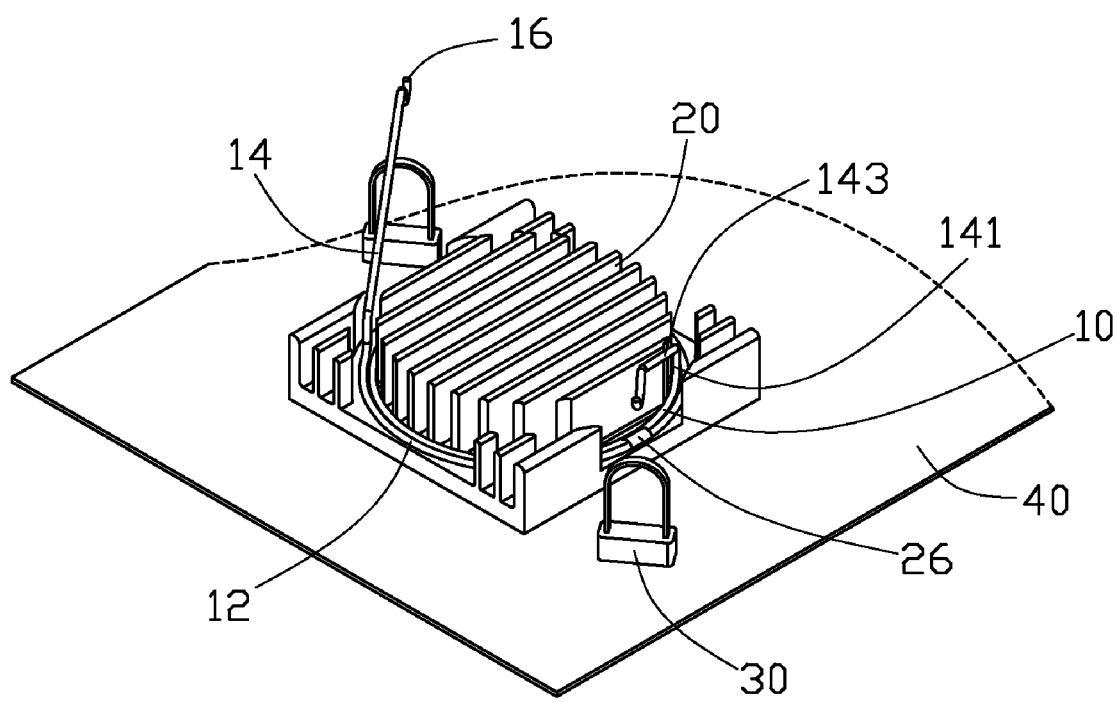
FIG. 1 is an assembled, isometric view of a clip, a heat sink, and a circuit board in accordance with a preferred embodiment of the present invention.
Figure 2:
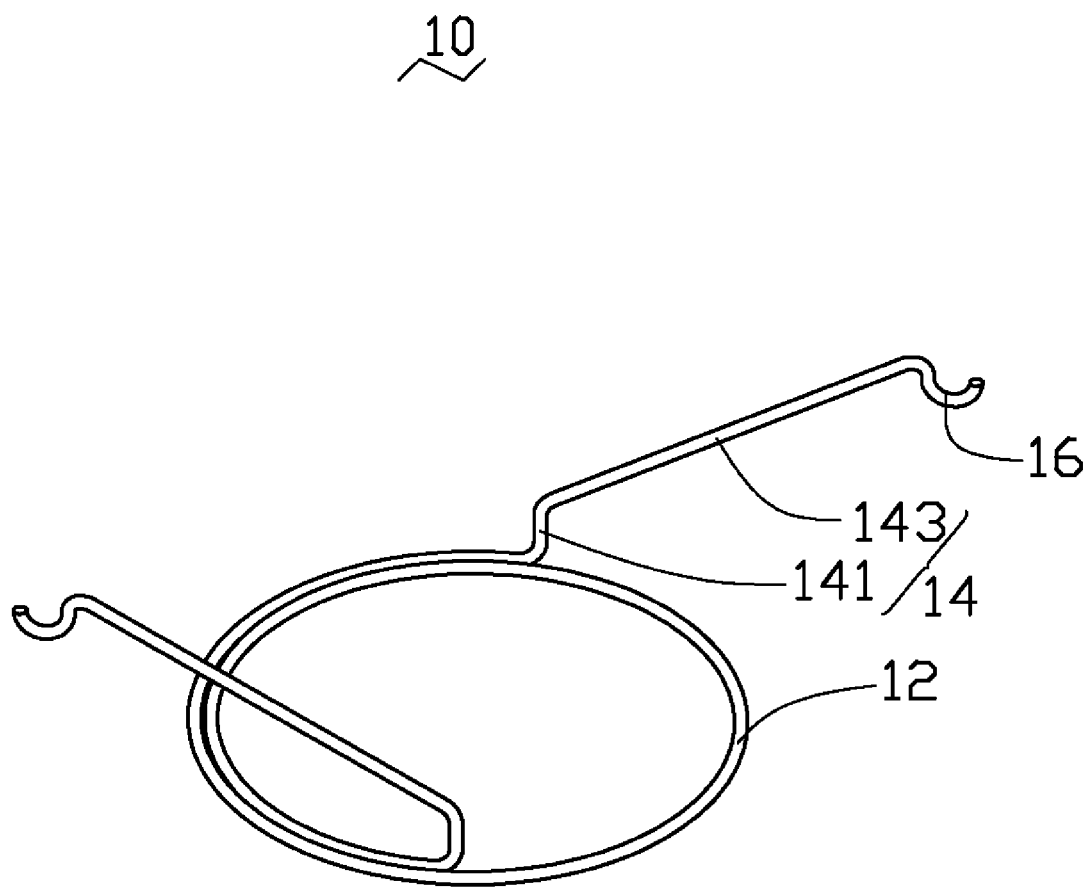
FIG. 2 is an isometric view of the clip of FIG. 1.
Figure 3:
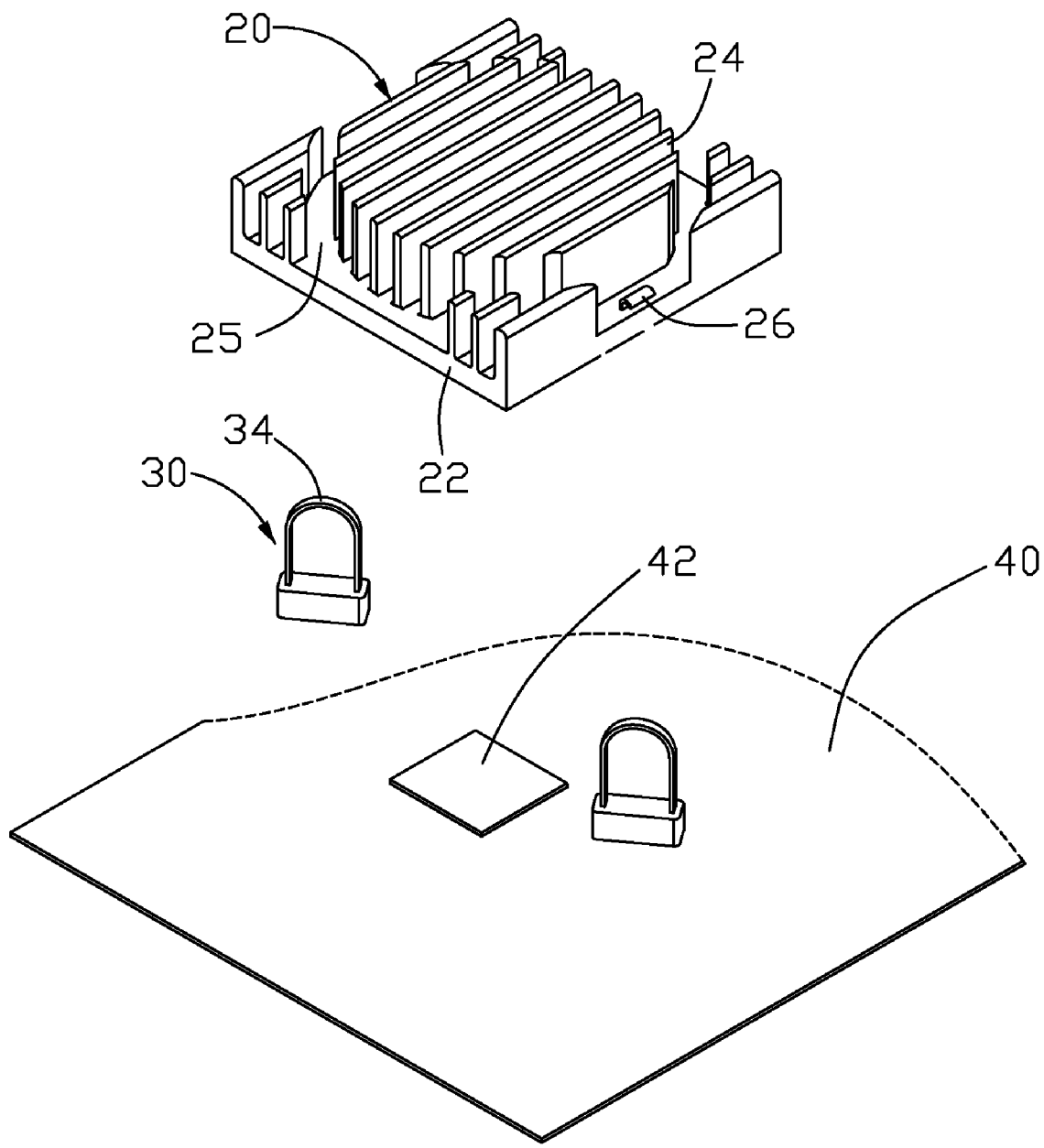
FIG. 3 is an exploded, isometric view of the heat sink and the circuit board of FIG. 1.

Referring to FIGS. 1 and 3, a clip 10 used for securing a heat sink 20 to a circuit board 40 in accordance with an embodiment of the present invention is shown.

The circuit board 40 includes an electronic component 42 mounted thereon and a pair of securing members 30 located adjacent opposite lateral sides of the electronic component 42 respectively. Each of the securing members 30 includes an arched catch 34. The securing members 30 are fixed to the circuit board 40 by any means known to those familiar with the art.

The heat sink 20 includes a base 22 having a bottom face thermally contacting with the electronic component 42, and a plurality of fins 24 extending upwardly and perpendicularly from a top face of the base 22. The plurality of fins 24 is cut to form a closed annular slot 25 therein. Two hooked flanges 26 are formed on the top face of the base 22 at opposite sides of the slot 25. The two hooked flanges 26 extend up from the base 22 and then bent toward the base 22. The two hooked flanges extend up from the top face of the base 22 and then bent toward the top face of the base 22.

The clip 10 is a wire with a positioning coil 12 bent from a middle portion thereof and the end portions of the wire are two elongated arms 14 extending from opposite points of the positioning coil 12. The arms 14 includes a straight portion 141 directly connected to the positioning coil 12 and extending straight up relative to a plane formed by the positioning coil 12 a predetermined distance generally equal to the depth of the annular slot 25, and a slant portion 143 extending from a distal end of straight portion in a way slantingly upwardly relative to the plane formed by the positioning coil 12, projecting lines of the arms 14 on the plane formed by the positioning coil 12 extend away from the coil 12 in opposite directions on parallel paths. A pair of hooks 16 is formed at distal portions of the slant portions 143 of the two arms 14 for engaging with the catches 34 of the securing members 30 respectively.

Figure 4:
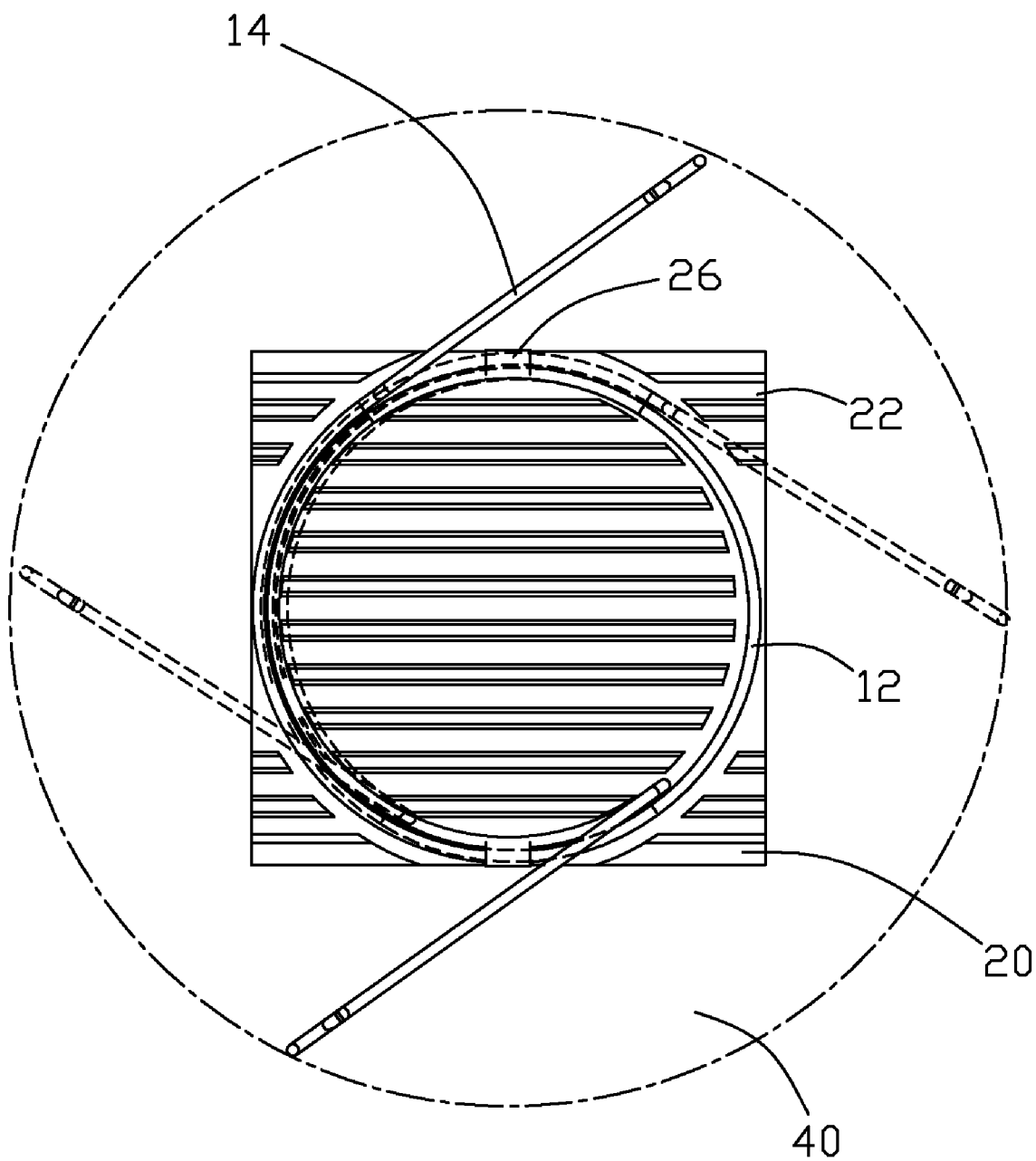
FIG. 4 is a perspective view of the clip of FIG. 1 mounted to the heat sink of FIG. 1.

Referring to FIG. 4, in use, the clip 10 is aligned with the slot 25 of the heat sink 20, with the two hooks 16 being positioned above corresponding securing members 30 of the circuit board 40. The clip 10 moves downwardly towards the heat sink 20 and the positioning coil 12 is rotatably retained in the slot 25 by the protruding portions 26. The clip 10 is rotated around the heat sink 20 until the arms 14 are generally in alignment with the securing members 30 on the circuit board 40. The two arms 14 are deformed toward the heat sink 20 to press the heat sink 20 tightly against the circuit board 40 via the position coil 12, then the two arms 14 are extended through the corresponding catches 34, and the two hooks 16 engage with corresponding catches 34 to hold the clip 10 in place.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A clip for mounting a heat sink on a circuit board, the heat sink comprising a base and a plurality of fins extending perpendicularly from a top face of the base, the clip comprising:

a positioning coil configured for rotatably engaging with the heat sink and abutting against the top face of the base, the positioning coil comprising two ends;

two elongated arms extending from the two ends of the positioning coil respectively, wherein each of the arms comprises a straight portion directly connected to the positioning coil and extending straight up relative to the top face of the base, the length of the straight portion is generally equal to the height of the fins, thereby avoiding interfering with the fins when the positioning coil rotates relative to the heat sink; and a pair of hooks formed at distal portions of the two arms respectively for engaging with the circuit board.

2. The clip as claimed in claim 1, wherein projecting lines of the arms on the plane formed by the positioning coil extend away from the positioning coil in opposite directions on parallel paths.

3. The clip as claimed in claim 1, wherein the two ends of the positioning coil are located at opposite ends of a bisecting line of the positioning coil.

4. An assembly comprising:

a heat sink defining an annular slot;

a circuit board comprising an electronic component and a pair of securing members mounted thereon; and a clip for mounting the heat sink to the electronic component; the clip comprising a positioning coil rotatably engaging in the slot of the heat sink and retained to the bottom of the slot, and two elongated arms extending from two ends of the positioning coil located at a bisecting line of the positioning coil respectively, for engaging with the securing members respectively, wherein each of the arms comprises a straight portion directly connects to the positioning coil, extending straight up from the bottom of slot, and has a length generally equal to the depth of the slot to prevent the arms from interfering with the fins when the positioning coil rotates in the slot.

5. The assembly as claimed in claim 4, wherein the heat sink includes a base having a bottom face thermally contacting with the electronic component, a plurality of fins extending upwardly and perpendicularly from a top face of the base, the slot is defined in the fins.

6. The assembly as claimed in claim 5, wherein each of the two arms further comprises a slant portion extending from a distal end of the straight portion and slanting upwardly relative to a plane formed by the positioning coil, projecting lines of the arms on the plane formed by the positioning coil extending away from the positioning coil in opposite directions on parallel paths.

7. The assembly as claimed in claim 4, wherein two hooked flanges are formed on the top face of the base and located at opposite sides of the slot, for holding the positioning coil of the clip to the heat sink.

8. The assembly as claimed in claim 4, wherein each of the securing members includes a catch thereon, and a pair of hooks is formed at distal portions of the two arms respectively, the hooks positioning coil are locked into corresponding catches of the securing members with the two arms being deformed to exert force on the positioning coil thereby holding the heat sink in reliable contact with the electronic component.

9. The assembly as claimed in claim 4, wherein the clip is made of a wire.

10. An assembly comprising:

a circuit board comprising an electronic component and a pair of securing members mounted thereon;

a heat sink placed on the electronic component, the heat sink defining an annular slot; and a clip for securing the heat sink to the electronic component, the clip being integrally made of a wire and comprising a positioning coil engaged in the slot of the heat sink in such a manner that the positioning coil is rotatable relative to the heat sink in a plane defined by the positioning coil and is fixed relative to the heat sink in a direction perpendicular to the plane, and two elongated arms respectively extending from two ends of the positioning coil located at a bisecting line of the positioning coil, the arms being depressable to deform and engage with the securing members respectively; wherein each of the arms comprises a straight portion directly connected to the positioning coil and extending straight up relative to the plane, and a slant portion extending from a distal end of the straight portion slantingly upwardly relative to the plane formed by the coil.

11. The assembly as claimed in claim 10, wherein each of the securing members comprises a catch, and a pair of hooks is formed at distal portions of the two arms respectively, the hooks capable of interlocking with the respective catches via depressing the two arms which results in the two arms being deformed to exert a force on the positioning coil toward the electronic component thereby holding the heat sink in reliable contact with the electronic component.

12. The assembly as claimed in claim 10, wherein the heat sink comprises a base and a plurality of fins extending up from the base, the slot is defined in the fins above the base, and two hooked flanges extend up from the base and then bent toward the base configured to hold the positioning coil of the clip in the slot such that the positioning coil is rotatable relative to the heat sink in the plane defined by the positioning coil and is fixed relative to the heat sink in the direction perpendicular to the plane.

\* \* \* \* \*